(12) United States Patent
Roesler et al.

(10) Patent No.: US 8,247,955 B2
(45) Date of Patent: Aug. 21, 2012

(54) ELECTROACOUSTIC COMPONENT

(75) Inventors: Ulrike Roesler, Hebertshausen (DE); Evelyn Riha, Nussdorf (DE); Werner Ruile, Munich (DE)

(73) Assignee: EPCOS AG, Munich (DE)

( * ) Notice: Subject to any disclaimer, the term of this patent is extended or adjusted under 35 U.S.C. 154(b) by 367 days.

(21) Appl. No.: 12/445,507

(22) PCT Filed: Oct. 12, 2007

(86) PCT No.: PCT/DE2007/001825
§ 371 (c)(1),
(2), (4) Date: Jan. 4, 2010

(87) PCT Pub. No.: WO2008/046393
PCT Pub. Date: Apr. 24, 2008

(65) Prior Publication Data
US 2010/0109485 A1  May 6, 2010

(30) Foreign Application Priority Data
Oct. 16, 2006  (DE) .......................... 10 2006 048 879

(51) Int. Cl.
*H01L 41/04* (2006.01)

(52) U.S. Cl. ................ 310/361; 310/313 A; 310/313 B; 310/313 C

(58) Field of Classification Search ............. 310/313 A, 310/313 B, 313 C, 313 D, 361
See application file for complete search history.

(56) References Cited

U.S. PATENT DOCUMENTS

| | | | |
|---|---|---|---|
| 4,400,640 A * | 8/1983 | Cho et al. | ................ 310/313 A |
| 5,081,389 A | 1/1992 | Abbott et al. | |
| 5,351,022 A | 9/1994 | Ruile et al. | |
| 5,365,206 A | 11/1994 | Machui et al. | |
| 5,379,010 A | 1/1995 | Ruile et al. | |
| 5,621,364 A | 4/1997 | Ruile et al. | |
| 5,691,698 A | 11/1997 | Scholl et al. | |
| 5,699,026 A | 12/1997 | Kurp et al. | |
| 5,966,008 A | 10/1999 | Maier et al. | |
| 6,031,315 A * | 2/2000 | Abbott | ................ 310/313 A |
| 6,084,503 A | 7/2000 | Ruile et al. | |
| 6,121,892 A | 9/2000 | Reindl et al. | |
| 6,420,815 B1 | 7/2002 | Tanaka et al. | |
| 6,420,946 B1 | 7/2002 | Bauer et al. | |
| 6,556,146 B1 | 4/2003 | Ruile et al. | |
| 6,677,696 B1 | 1/2004 | Ruile et al. | |
| 6,847,271 B2 | 1/2005 | Korden et al. | |

(Continued)

FOREIGN PATENT DOCUMENTS

EP  0 560 634  11/1998

(Continued)

OTHER PUBLICATIONS

International Search Report for PCT/DE2007/001825.

(Continued)

*Primary Examiner* — Walter Benson
*Assistant Examiner* — Bryan Gordon
(74) *Attorney, Agent, or Firm* — Fish & Richardson P.C.

(57) ABSTRACT

An electroacoustic component includes a substrate that includes a quartz single crystal. The quartz single crystal has a first Euler angle $\lambda$: $-5° \leq \lambda \leq 5°$, a second Euler angle $\mu$, and a third Euler angle $\theta$. A contiguous region of the quartz single crystal has the following vertices $P_i(\mu_i, \theta_i)$: (23°, 20°), (60°, 17°), (110°, 30°), (105°, 42°), (60°, 30°), (23°, 25°).

14 Claims, 2 Drawing Sheets

U.S. PATENT DOCUMENTS

| | | | |
|---|---|---|---|
| 7,057,478 B2 | 6/2006 | Korden et al. | |
| 7,065,331 B2 | 6/2006 | Korden et al. | |
| 7,170,372 B2 | 1/2007 | Ruile et al. | |
| RE39,538 E | 4/2007 | Bauer et al. | |
| 7,262,676 B2 | 8/2007 | Ruile et al. | |
| 7,304,553 B2 | 12/2007 | Bauer et al. | |
| 7,345,409 B2 | 3/2008 | Leidl et al. | |
| 7,411,291 B2 | 8/2008 | Baier et al. | |
| 7,449,812 B2 | 11/2008 | Hauser et al. | |
| 7,459,991 B2 | 12/2008 | Ruile et al. | |
| 2002/0017828 A1* | 2/2002 | Roesler | 310/313 A |
| 2004/0033794 A1 | 2/2004 | Korden et al. | |
| 2004/0061575 A1* | 4/2004 | Kando et al. | 333/195 |
| 2004/0104789 A1 | 6/2004 | Korden et al. | |
| 2004/0247153 A1 | 12/2004 | Ruile et al. | |
| 2005/0012570 A1 | 1/2005 | Korden et al. | |
| 2005/0127781 A1* | 6/2005 | Yamazaki et al. | 310/313 A |
| 2005/0174014 A1 | 8/2005 | Korden et al. | |
| 2005/0212620 A1 | 9/2005 | Bauer et al. | |
| 2006/0076852 A1 | 4/2006 | Ruile et al. | |
| 2006/0103486 A1 | 5/2006 | Ruile et al. | |
| 2006/0158061 A1 | 7/2006 | Hauser et al. | |
| 2006/0175639 A1 | 8/2006 | Leidl et al. | |
| 2006/0284307 A1 | 12/2006 | Baier et al. | |
| 2007/0241841 A1 | 10/2007 | Hauser et al. | |
| 2007/0296306 A1 | 12/2007 | Hauser et al. | |
| 2007/0296513 A1 | 12/2007 | Ruile et al. | |
| 2008/0012450 A1 | 1/2008 | Meister et al. | |
| 2008/0094150 A1 | 4/2008 | Meister et al. | |
| 2008/0252396 A1 | 10/2008 | Ruile et al. | |
| 2008/0266024 A1 | 10/2008 | Ruile et al. | |
| 2008/0292127 A1 | 11/2008 | Ruile et al. | |
| 2008/0297277 A1 | 12/2008 | Meister et al. | |
| 2009/0011554 A1 | 1/2009 | Baier et al. | |

FOREIGN PATENT DOCUMENTS

| | | |
|---|---|---|
| EP | 0 886 375 | 12/1998 |
| EP | 1 542 361 | 6/2005 |
| EP | 1 659 687 | 5/2006 |
| WO | WO 99/04488 | 1/1999 |

OTHER PUBLICATIONS

Written Opinion for PCT/DE2007/001825.

Pereira da Cunha M. et al "Experimental and Predicted SAW Temperature Behavior of Langatate" IEEE Ultrasonics Symp. vol. 1, Oct. 22-25, 2000 pp. 245-248.

Ballato A et al "Power Flow Angle and Pressure Dependence of SAW Propagation Characteristics in Quartz" IEEE Ultrasonics Symp. 1981, pp. 346-349.

Newton C. O. "A Study of the Propagation Characteristics of the Complete Set of SAW Paths on Quartz with Zero Temperature Coefficient of Delay" IEEE Ultrasonics Symp. 1979, pp. 632-636.

Oates D. E. et al "Effects of Temperature Dependent Anisotropy in RAC Devices and a Cut of Quartz for a Temperature-Compensated RAC" IEEE Ultrasonics Symp. 1979, pp. 691-695.

Shimizu Y. et al "SAW Propagation Characteristics on a-Quartz with Arbitrary Cut" Proc. of $1^{st}$ Symp. on Ultrasonic Electronics, Tokyo 1980. Japanese J. of Appl. Phys., vol. 20, 1981, pp. 127-130.

Webster R. T. "Cubic Temperature Dependence for SAWs on X-cut Quartz" IEEE Transactions on Ultrasonics, Ferroelectrics and Frequency Control, vol. 35, No. 3, May 1988, pp. 386-389.

Webster R. T. "X-Cut Quartz for Improved Surface Acoustic Wave Temperature Stability" J. Appl. Phys. 56 (5) Sep. 1984, pp. 1540-1542.

Williams D. F. et al "Temperature Stable SAW Devices Using Doubly Rotated Cuts of Quartz" IEEE Ultrasonics Symposium 1980, pp. 429-433.

English translation of Written Opinion for PCT/DE2007/001825.

* cited by examiner

ELECTROACOUSTIC COMPONENT

BACKGROUND

Sections of quartz single crystals, which have a favorable frequency response at low temperature, are known, e.g., from US 2005/0127781.

SUMMARY

In one aspect, an electroacoustic component comprises a substrate that includes a quartz single crystal. The quartz single crystal has a first Euler angle $\lambda$: $-5° \leq \lambda \leq 5°$, a second Euler angle $\mu$, and a third Euler angle $\theta$. A contiguous region of the quartz single crystal has the following vertices $P_i(\mu_i, \theta_i)$: (23°, 20°), (60°, 17°), (110°, 30°), (105°, 42°), (60°, 30°), (23°, 25°).

In one example of the electroacoustic component, $-0.5° \leq \lambda \leq 2.5°$. In another example, $102° \leq \mu \leq 108°$ and $34.25° \leq \theta \leq 40.25°$.

In another aspect, an electroacoustic component comprises a substrate comprising a quartz single crystal. The quartz single crystal has a first Euler angle $\lambda$: $-5° \leq \lambda \leq 5°$, a second Euler angle $\mu$: $20° \leq \mu \leq 110°$, and a third Euler angle $\theta$: $15° \leq \theta \leq 45°$.

Electrodes may be included in the electroacoustic component, on the substrate, for exciting an acoustic wave having a wavelength $\lambda_0$. The electrodes may comprise metallic aluminum. A weight proportion of aluminum in the electrodes may be at least 80%. A height of the electrodes relative to the wavelength may be at most 2.5%. An acoustic reflection at the electrodes may be at least 1%. A height of the electrodes relative to the wavelength may be at most 4%.

A magnitude of a quadratic temperature coefficient associated with the electroacoustic component may not exceed $2 \times 10^{-8}/K^2$.

The electroacoustic component may comprise a resonator comprising a transducer in which an acoustic wave is excitable electrically.

In one example of the electroacoustic component, $-0.5° \leq \lambda \leq 2.5°$. In another example, $102° \leq \mu \leq 108°$ and $34.25° \leq \theta \leq 40.25°$.

In another aspect, an electroacoustic component comprises a substrate comprising a quartz single crystal. The quartz single crystal has a first Euler angle $\lambda$, second Euler angle $\mu$, and third Euler angle $\theta$. The first, second and third Euler angles are in the following ranges: $28° \leq \lambda \leq 32°$, $|\mu - 90°| > 5°$, and $135° \leq \theta \leq 160°$.

In one example of the electroacoustic component, $20° < |\mu - 90°| < 55°$. In another example, $\lambda = 30°$, $25° < |\mu - 90°| < 34°$ and $146° \leq \theta \leq 153°$.

In another aspect, an electroacoustic component comprises a substrate comprising a quartz single crystal. The quartz single crystal has a first Euler angle $\lambda$: $-5° \leq \lambda \leq 28°$, a second Euler angle $\mu$: $20° < \mu \leq 110°$, and a third Euler angle $\theta$: $10° \leq \theta \leq 45°$.

In another aspect, an electroacoustic component comprises a substrate comprising a quartz single crystal. The quartz single crystal has a first Euler angle $\lambda$: $5° \leq \lambda \leq 28°$, a second Euler angle $\mu$: $40° \leq \mu \leq 140°$, and a third Euler angle $\theta$: $135° \leq \theta \leq 160°$.

In one example of the electroacoustic component, $7° \leq \lambda \leq 13°$, $122° \leq \mu \leq 128°$ and $137° \leq \theta \leq 143°$. In another example, $5° \leq \lambda \leq 28°$, $60° \leq \mu \leq 75°$ and $147° \leq \theta \leq 160°$. In another example, $-14° \leq \lambda \leq 21°$.

DETAILED DESCRIPTION

Figure 1:
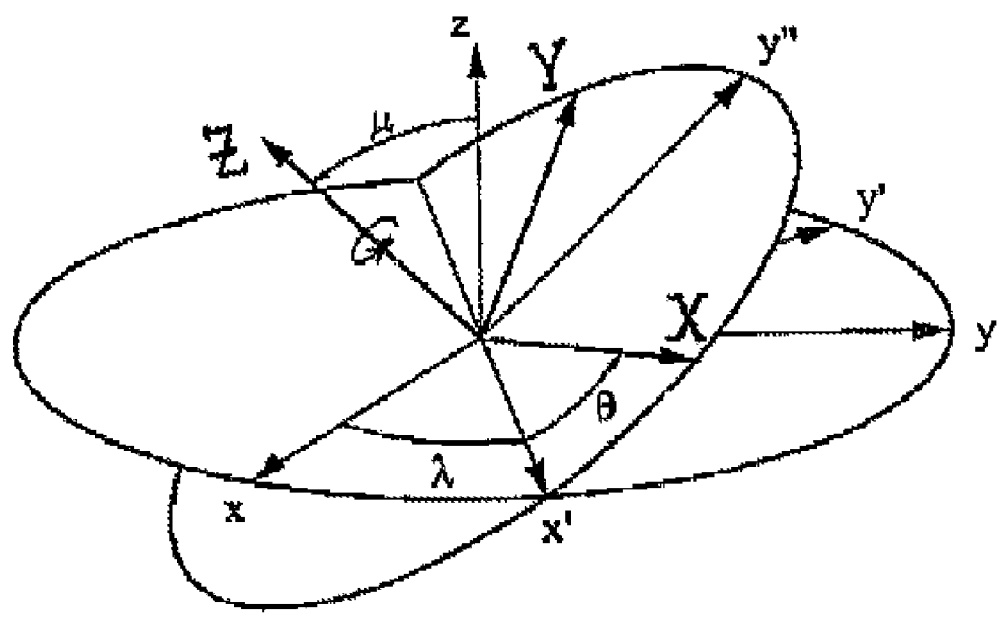
FIG. 1 is a diagram showing Euler angles of a crystal section used in an acoustic wave component.

Described herein is an acoustic wave component that, in addition a low temperature frequency response, also has relatively low losses due to undesired wave emission.

An acoustic wave component is described, which includes a substrate made of a quartz single crystal. The crystal section of the substrate is selected such that a high acoustic reflection of >1% and a low temperature frequency response of <25 ppb/$K^2$ are achieved using relatively light electrodes having a low height. In one variant, the electrodes have a high aluminum content by weight, e.g., at least 80%. The height of the electrodes relative to the wavelength may be <3.5%.

The temperature response of frequency f of an electroacoustic component can be described by a Taylor series: $df/f = T0 + TCF1 \, \Delta T + TCF2(\Delta T)^2 + \ldots$, where df is the temperature-induced deviation of the frequency of the component at a temperature difference of $\Delta T$. This can be, for instance, the temperature deviation from room temperature or a predetermined reference temperature. The coefficient TCF1 preceding the linear term of this series is referred to as the linear coefficient of thermal expansion. The coefficient TFC2 preceding the quadratic term of this series is referred to as a quadratic temperature coefficient. The curve df/f is essentially a parabola. The parameter T0, which is called the temperature reversal point, corresponds to the extremum of this parabola.

Using the crystal sections specified below, it is possible to obtain a high coupling, a good acoustic reflection, and, at the same time, a low temperature frequency response with a quartz single crystal, despite moderate layer thickness of the electrodes. A low temperature response is advantageous for an acoustic component if applications for the component require a stable frequency over a predetermined temperature range.

The component can have a resonator with a transducer in which the acoustic wave can be excited electrically. A transducer generally has an electrode grid. The electrodes are metal strips arranged roughly perpendicular to the wave propagation direction. The beam-steering effect appearing on some sections can be taken into account by a slight tilting of the electrodes against the propagation direction of the wave. The transducer can be arranged between two acoustic reflectors that are suitable for localizing the acoustic wave in the active area of the transducer.

Metal structures on a piezoelectric layer, such as quartz, have the property of reflecting a propagating acoustic wave. The intensity of the reflection depends on, among other things, the height and physical properties of the metal structures as well as on the properties of the substrate.

In case of a relatively high reflection of the wave at a metal strip, reflector structures with only a few metal strips can be used to largely prevent wave propagation outside of an active area of the component. This is advantageous since it promotes miniaturizing the component.

A crystal section can be specified by three Euler angles. The Euler angles will be explained below with reference to FIG. 1. The first Euler angle will be designated below by $\lambda$, the second Euler angle by $\mu$ and the third Euler angle by $\theta$.

For $\mu \in (\mu_{min}, \mu_{max})$ we have: $\theta \in (\theta_{min}; \theta_{max})$. The limits of a contiguous advantageous ($\mu$, $\theta$) region can be described in a ($\mu$, $\theta$) diagram for a given $\lambda$ by a polygonal traverse.

Due to crystal symmetry of the quartz single crystal, the angles $\theta$ and $(180° - \theta)$ are considered equivalent at $\lambda = 0°$ with respect to the properties dealt with below. At $\lambda=30°$, the angles $\mu$ and $(180°\pm\mu)$ are considered equivalent.

According to a first embodiment, an electroacoustic component includes a substrate made of a quartz single crystal and electrodes on the substrate for exciting an acoustic wave with wavelength $\lambda_0$. The height of the electrodes relative to the wavelength is at most 2.5%. Despite the relatively low height of the electrodes, which contain a high content of relatively light aluminum by weight, it was possible to obtain a high acoustic reflection >1% with suitable crystal sections specified below. At the same time, this component has an improved temperature response, less than 25 ppb/$K^2$, compared with the known STX quartz section.

According to a second embodiment, an electroacoustic component includes a substrate of monocrystalline quartz, the Euler angles $\lambda$, $\mu$ and $\theta$ of which are in the following ranges: $-5°\leq\lambda\leq5°$, $20°\leq\mu\leq110°$ and $15°\leq\theta\leq45°$. In one example Euler angles of the substrate plate are in the ($\mu$; $\theta$) plane inside a polygon, the vertices of which are defined by the following points P ($\mu_i$, $\theta_i$): (23°, 20°), (60°, 17°), (110°, 30°), (105°, 42°), (60°, 30°), and (23°, 25°).

The crystal section with $\lambda=0°$, $\mu=(105\pm4)°$ and $\theta=(37.25\pm4)°$ is considered advantageous, for instance, for the electrode height h/$\lambda_0$ of ca. 1.5%-2.5%, with h being the absolute electrode height.

By rotation of the section plane, the position of the angle ranges with preferred properties shifts in such a manner that other preferred ranges result for substrates with the Euler angle $\lambda\neq0$. This will be described in detail below.

According to a third embodiment, an electroacoustic component includes a substrate of monocrystalline quartz, the Euler angles $\lambda$, $\mu$ and $\theta$ of which are in the following ranges: $28°\leq\lambda\leq32°$, $|\mu-90°|>5°$ and $135°\leq\theta\leq160°$. Inside this range, crystal sections with $25°<|\mu-90°|<34°$ and $\theta=(149.5+3.5)°$ are considered advantageous. The crystal section with $\lambda=30°$, $\mu=119°$ and $\theta=147.5°$ is advantageous.

According to a fourth embodiment, an electroacoustic component includes a substrate of monocrystalline quartz with the Euler angle $5°<\lambda<28°$, in which $\theta$ and $\mu$ are inside one of the following ranges: $20°<\mu\lambda110°$ and $10°\leq\theta\leq45°$ or $40°\leq\mu\leq140°$ and $135°\leq\theta\leq160°$. The angle range with $14\leq\lambda\leq21°$, $60°\leq\mu\leq75°$ and $147°\leq\theta\leq160°$ produces a favorable low temperature response.

Exemplary configurations of the component will be specified below.

Electrodes, generally forming a periodic grid, for exciting an acoustic wave of wavelength $\lambda_0$ are on the substrate.

The electrodes may contain Al or an Al alloy. For example, they can comprise at least one Al layer, but also other layers, in particular, a Cu layer. Other metals are also suitable for electrodes.

The height of the electrodes can be, for instance, up to 4% of the wavelength. In an advantageous variant, the height of the electrodes relative to the wavelength is not more than 2.5%, in which case a relatively high acoustic reflection at the electrode edges of at least 1% can be achieved, due to the selected crystal section.

The crystal section, the metallization height of the electrodes, and the proportion of metallized surface area in the acoustically active region of the component may be selected such that the temperature reversal point T0 is at room temperature, i.e., at roughly 30° C.

The proportion of metallized surface area in the acoustically active region of the component may be between 0.3 and 0.7, but is not limited to this range.

Another advantage of the specified crystal sections is that with them, a relatively small value of the quadratic temperature coefficient, the magnitude of which does not exceed $2\times10^{-8}/K^2$, can be achieved, where the coefficient T0 corresponds roughly to 30° C. This leads to a low frequency response to temperature, particularly in a temperature range between −20° C. and +8° C.

Using the section angle ranges, it is possible to achieve a relatively high electroacoustic coupling coefficient K in the electroacoustic component, where: $K^2>0.08\%$.

The specified component is suitable for exciting surface acoustic waves. The excitation of guided bulk acoustic waves can also be considered, however.

It was found that crystal sections of the quartz in the region that extends essentially diagonally in the ($\mu$, $\theta$) diagram between two lines from the point (30°, 20°) to the point (150°, 55°) and from the point (60°, 15°) to the point (150°, 40°) are distinguished by a low TCF2 at $\lambda=0$. The width of the region in the $\theta$ direction varies and is roughly 15° to 20°. This applies particularly for the electrode height h/$\lambda_0$ up to 4%. For other layer heights the range can shift by up to 10% in the $\theta$ direction.

For $\lambda=0°$ and h/$\lambda_0$ of 1.5% to 3.5% a section angle range with $\mu$ between 30° and 60° and $\theta$ between 20° and 30° is advantageous, as is a second section angle range with $\mu$ between 60° and 110° and $\theta$ between 23° and 45°. At ca. 2% of the relative electrode thickness, an acoustic reflection of greater than 0.75% can be achieved in the first and second angle area.

The following are examples for crystal sections for the relative electrode height h/$\lambda_0$=ca. 2%:
(0°; 70°; 25.25°) or (0°; 70°; 154.75°),
(0°; 80°; 27.9°) or (0°; 80°; 152.1°),
(0°; 90°; 31.25°) or (0°; 90°; 148.75°),
(0°; 100°; 35.25°) or (0°; 100°; 144.75°),
(0°; 105°; 37.25°) or (0°; 105°; 142.75°), and
(0°; 110°; 39.1°) or (0'; 110'; 140.9°).

For $\lambda=0°$ a contiguous region was found, the vertices of which are defined by the following points $P_i(\mu_i, \theta_i)$: (23°, 20°), (60°, 17°), (110°, 30°), (105°, 42°), (60°, 30°), and (23°, 25°).

For $\lambda>0°$, in particular, $0°\leq\lambda\leq30°$, the following advantageous section angle range was found: $30°<\mu\leq160°$; $135°\leq\theta\leq155°$.

For instance, it was found with the crystal section (10°, 125°, 140°) at h/$\lambda_0$=2% that TCF2=−15 ppb/$K^2$. For the section (30°, 119°, 147.5°), it was calculated that TCF2=−17 ppb/$K^2$, and for the section (20°, 68°, 150°), it was calculated that TCF2=−19 ppb/$K^2$.

The Euler angles will be explained below with reference to FIG. 1.

The axes of the crystallographic coordinate system (x, y, z) are oriented along the crystal axes (a, b, c) of an elementary cell of the single crystal. The first Euler angle $\lambda$ describes a rotation of the coordinate system counterclockwise about the z axis (see FIG. 1). The once-rotated coordinate system is designated as (x', y', z). The second Euler angle $\mu$ describes a rotation of the once-rotated coordinate system about the x' axis. There, one changes to the (x', y'', z) coordinate system. The third Euler angle $\theta$ describes a rotation of the twice-rotated coordinate system about the z axis. The X axis of the now obtained coordinate system (X, Y, Z) is oriented in the direction provided as the propagation direction of the acoustic wave. The acoustic wave propagates in the X, Y plane, which is also referred to as the section plane of the substrate. The Z axis is the normal line to this plane.

Figure 2:
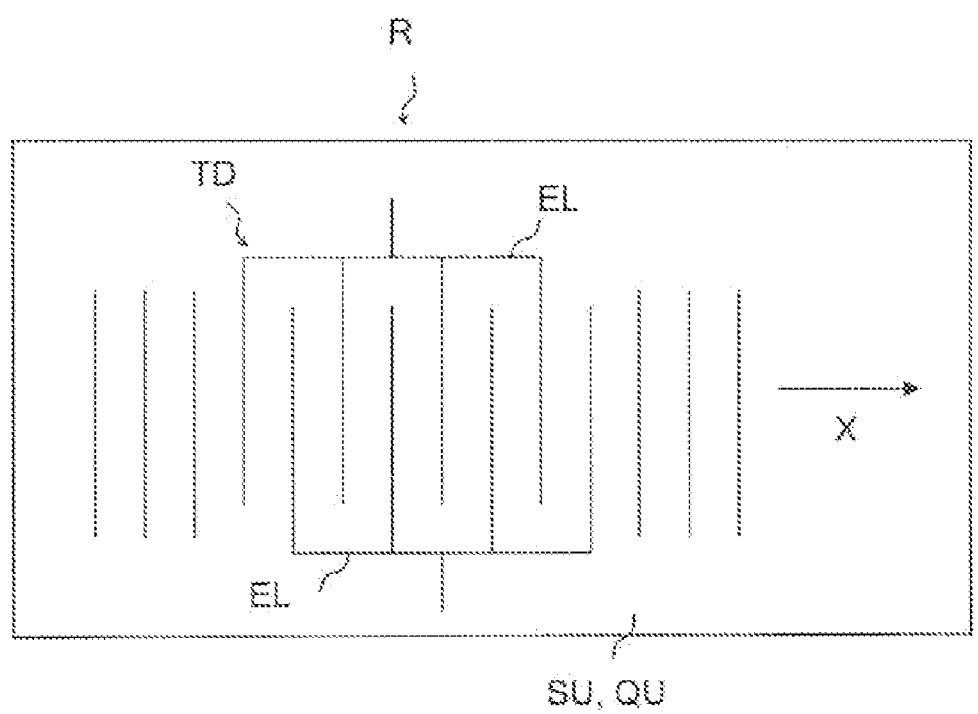
FIG. 2 shows an example of a resonator.

FIG. 2 shows an example resonator R having a quartz crystal QU as a substrate SU. A transducer TD and a reflector R are arranged on the substrate SU. The transducer includes electrodes whose fingers are interdigitated, and which is arranged between reflector structures. A direction of propagation of a surface acoustic wave is shown by the arrow labeled X.

The invention claimed is:

1. An electroacoustic component comprising:
a substrate comprising a quartz single crystal, the quartz single crystal having a first Euler angle $\lambda$, second Euler angle $\mu$, and third Euler angle $\theta$, the first, second and third Euler angles being in the following ranges:
$28° \leq \lambda \leq 32°$, $|\mu-90°| > 5°$, and $135° \leq \theta \leq 160°$.

2. The electroacoustic component of claim 1, wherein: $20° < |\mu-90°| < 55°$.

3. The electroacoustic component of claim 1, wherein: $\lambda=30°$, $25° < |\mu-90°| < 34°$ and $146° \leq \theta \leq 153°$.

4. An electroacoustic component comprising:
a substrate comprising a quartz single crystal, the quartz single crystal having a first Euler angle $\lambda$: $5° \leq \lambda \leq 28°$, a second Euler angle $\mu$: $40° < \mu \leq 140°$, and a third Euler angle $\theta$: $135° \leq \theta \leq 160°$.

5. The electroacoustic component of claim 4, wherein: $7° \leq \lambda \leq 13°$, $122° \leq \mu \leq 128°$ and $137° \leq \theta \leq 143°$.

6. The electroacoustic component of claim 4, wherein: $5° \leq \lambda \leq 28°$, $60° \leq \mu \leq 75°$ and $147° \leq \theta \leq 160°$.

7. The electroacoustic component of claim 6, wherein: $14° \leq \lambda \leq 21°$.

8. The electroacoustic component of claim 4, further comprising:
electrodes, on the substrate, for exciting an acoustic wave having a wavelength $\lambda_0$.

9. The electroacoustic component of claim 8, wherein the electrodes comprise metallic aluminum.

10. The electroacoustic component of claim 9, wherein a weight proportion of aluminum in the electrodes is at least 80%.

11. The electroacoustic component of claim 8, wherein a height of the electrodes relative to the wavelength is at most 2.5%; and
wherein an acoustic reflection at the electrodes is at least 1%.

12. The electroacoustic component of claim 8, wherein a height of the electrodes relative to the wavelength is at most 4%.

13. The electroacoustic component of claim 4, wherein a magnitude of a quadratic temperature coefficient associated with the electroacoustic component does not exceed $2 \times 10^{-8}/K^2$.

14. The electroacoustic component of claim 4, comprising a resonator comprising a transducer in which an acoustic wave is excitable electrically.

* * * * *